United States Patent
Kim et al.

(10) Patent No.: US 7,317,766 B2
(45) Date of Patent: Jan. 8, 2008

(54) APPARATUS AND METHOD FOR DEMODULATING SIGNAL

(75) Inventors: Ki-hyun Kim, Gyeonggi-do (KR); Sung-hyu Han, Seoul (KR); In-sik Park, Gyeonggi-do (KR); Jae-Seong Shim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 840 days.

(21) Appl. No.: 10/446,641

(22) Filed: May 28, 2003

(65) Prior Publication Data

US 2004/0028150 A1 Feb. 12, 2004

(30) Foreign Application Priority Data

Jun. 3, 2002 (KR) .................. 10-2002-0031065

(51) Int. Cl.
*H03K 9/00* (2006.01)
*H04L 27/00* (2006.01)

(52) U.S. Cl. ........................ 375/316; 375/341
(58) Field of Classification Search ................ 375/316, 375/341
See application file for complete search history.

(56) References Cited

U.S. PATENT DOCUMENTS 5,751,232 A * 5/1998 Inoue et al. .................. 341/63
5,944,842 A * 8/1999 Propp et al. ................. 714/701

FOREIGN PATENT DOCUMENTS

| EP | 351 055 | 1/1990 |
|---|---|---|
| EP | 1 047 197 | 10/2000 |
| EP | 1 187 335 | 3/2002 |

OTHER PUBLICATIONS

Patrick Robertson et al., "A Comparison of Optimal and Sub-Optimal MAP Decoding Algorithms Operating in the Log Domain", Jun. 18, 1995, p. 1009-1013.

* cited by examiner

*Primary Examiner*—David C. Payne
*Assistant Examiner*—Nader Bolourchi
(74) *Attorney, Agent, or Firm*—Stein, McEwen & Bui, LLP

(57) ABSTRACT

An apparatus for and a method of signal demodulation which reduces a number of calculations required for demodulating an M-bit codeword which has been modulated from an N-bit codeword. Probability data for each bit of the M-bit codeword is tested to determine if the probability data indicates a high reliability of being either a one or a zero. Bits having the high reliability are compared with corresponding bits in each of a plurality of reference codewords and the codewords having bits which match the corresponding bits having the high reliability are used along with the probability data to calculate a probability of each bit of the N-bit codeword. As a number of bits having the high reliability increases, a number of calculations required to calculate the probability of each bit of the N-bit codeword decreases.

22 Claims, 5 Drawing Sheets

FIG. 3A

| INPUT DATA BIT | CHANNEL BIT |
|---|---|
| 00 | 101 |
| 01 | 100 |
| 10 | 001 |
| 11 | 010 |

FIG. 3B

| INPUT DATA BIT | CHANNEL BIT |
|---|---|
| 00.00 | 101.000 |
| 00.01 | 100.000 |
| 10.00 | 001.000 |
| 10.01 | 010.000 |

FIG. 4

| DATA WORD | 00 | 01 | 10 | 11 |
|---|---|---|---|---|
| CODEWORD | 040 | 041 | 010 | 021 |
| | 050 | 042 | 011 | 022 |
| | 051 | 044 | 012 | 024 |
| | 052 | 045 | 020 | 025 |
| | 101 | 201 | 110 | 121 |
| | 102 | 202 | 111 | 122 |
| | 104 | 204 | 112 | 124 |
| | 105 | 205 | 120 | 125 |
| | 240 | 241 | 210 | 221 |
| | 250 | 242 | 211 | 222 |
| | 251 | 244 | 212 | 224 |
| | 252 | 245 | 220 | 225 |
| | 440 | 401 | 410 | 421 |
| | 450 | 402 | 411 | 422 |
| | 451 | 404 | 412 | 424 |
| | 452 | 405 | 420 | 425 |
| | 501 | 441 | 510 | 521 |
| | 502 | 442 | 511 | 522 |
| | 504 | 444 | 512 | 524 |
| | 505 | 445 | 520 | 525 |

FIG. 5

| $R_K$ | -0.8 | 0 | 0 | 0.8 | 0 | 0.7 | 0 | 0 | -0.9 |
|---|---|---|---|---|---|---|---|---|---|
| CODEWORD | 0 | 0 | 0 | 1 | 0 | 0 | 0 | 0 | 0 |
| | 0 | 0 | 0 | 1 | 0 | 1 | 0 | 0 | 0 |
| | 0 | 0 | 0 | 1 | 0 | 1 | 0 | 0 | ✕ |
| | 0 | 0 | 0 | 1 | 0 | 1 | 0 | 1 | 0 |
| | ⋮ | | | ⋮ | | | ⋮ | | |
| | ✕ | 0 | 0 | 1 | 0 | 0 | 0 | 0 | ✕ |
| | ✕ | 0 | 0 | 1 | 0 | 0 | 0 | 1 | 0 |
| | ✕ | 0 | 0 | 1 | 0 | 0 | 1 | 0 | 0 |
| | ✕ | 0 | 0 | 1 | 0 | 0 | 1 | 0 | ✕ |

APPARATUS AND METHOD FOR DEMODULATING SIGNAL

BACKGROUND OF THE INVENTION

This application claims the priority of Korean Patent Application No. 2002-31065, filed Jun. 3, 2002, in the Korean Intellectual Property Office, the disclosure of which is incorporated herein by reference.

1. Field of the Invention

The present invention relates to an apparatus for and a method of signal demodulation, and more particularly, to an apparatus for and a method of signal demodulation of a run length limit (RLL) code.

2. Description of the Related Art

Generally, in an environment where there is inter symbol interference (ISI) of data, for example, in a high density optical recording medium, considering problems caused by the ISI phenomena, the RLL code is used to modulate data.

FIGS. 3A and 3B show RLL encoding tables of a (1, 7) code. FIG. 3A shows a basic encoding table when a code having a code rate of ⅔ is used, and FIG. 3B shows a replacement table for a violation occurring when the basic encoding table of FIG. 3A is used.

The (1, 7) code is a code in which a minimum number of contiguous 0's between a 1 and a next 1 in a modulated signal is one and a maximum number of contiguous 0's is seven. The code rate of ⅔ indicates modulation of a 2-bit data word into a 3-bit codeword.

However, when the basic encoding table of FIG. 3A is used, a violation of the rule described above occurs. For example, when input data bits are 0000 according to the basic encoding table of FIG. 3A, the encoded channel bits are 101101, and thus, 1 occurs continuously. In order to solve the above problem, the replacement table shown in FIG. 3B is used so that the encoding rule can be observed considering relations of input data with previous input data and next input data. Accordingly, in order to obtain a 2-bit data word through decoding, a 9-bit codeword is decoded.

In a conventional method for decoding an RLL code, a channel detector, for example a Viterbi decoder, receives a channel signal, detects codewords and outputs the detected codewords. An RLL decoding unit decodes the codewords into data words using an RLL decoding table.

Recently, however, concepts of a soft channel detector and a soft modulator have been introduced. The output of the Viterbi decoder described above is a codeword itself, and has a value of 1 or −1. The above method is referred to as a hard demodulation and another method is referred to as soft demodulation. In the soft demodulation, a soft channel detector receives a channel signal, and outputs data indicating a probability value of a codeword. That is, the data output by the soft demodulation method has an analog value, such as 0.8 or −0.8 instead of 1 or −1, and the analog value indicates a probability that the code value is 1 or −1. A soft demodulator receives data indicating the probability value of the codeword, and outputs data indicating the probability of a data word. Then, a decoder such as a turbo decoder finally decodes the data word.

A detailed description of soft modulation may be found in an article entitled "Near-optimum Decoding of Product Codes" (R.Pyndiah, IEEE Transactions on Communications, vol. 46, No. 8, pp1003-1010). Explanations of a soft channel detector are detailed in articles entitled "A Comparison of Optimal and Sub-optimal MAP Decoding Algorithms Operating in the Log Domain" (P. Robertson, E. Villebrun, and P. Hoeher, Communications, 1995, ICC '95 Seattle, 'Gateway to Globalization', 1995 IEEE International Conference on, vol. 2, 1995 pp1009-1013 vol. 2) and "A Viterbi Algorithm with Soft Decision Outputs and Its Applications," (J. Hagenauer and P. Hoeher, Proc. GLOBECOM, '89, pp1680-1786, November 1989). An explanation of turbo decoding requiring soft modulation is detailed in an article entitled "Turbo Decoding with RLL Code for Optical Storage" (E. Yamade, ISOMO1).

Referring to FIG. 4, a process in which the soft demodulator described above receives R(n), which is data indicating the probability value of a codeword, and obtains a likelihood ratio (LR), which is a value indicating the probability of each bit forming a data word, will now be explained.

Here, an example in which the code rate is ⅔ and the RLL(1, 7) code is used will be explained. FIG. 4 shows a decoding table of the RLL(1, 7) code. The first line shows data words with a 2-bit length, which are the results of decoding. The remaining lines show codewords represented in an octal notation, each codeword corresponding to a data word. For example, codeword 040 corresponds to a binary number 000 100 000.

First, in order to obtain an LR, APP(d=1) and APP(d=0) are obtained. APP(d=1) is a value indicating a probability that demodulated data is 1, and APP(d=0) is a value indicating a probability that demodulated data is 0.

APP(d=1) and APP(d=0) are obtained by equation 1:

$$APP(d=1) = \sum_{i=1}^{s1} \exp\left[\sum_{l=1}^{L} (C_l^i - R_l)^2\right] \quad (1)$$

In equation 1, since the code rate is ⅔, L is 9. $R_l$ is a value indicating the probability value of a bit which is the l-th bit of 9 data bits respectively indicating probability values of 9 code bits forming one codeword that is input to the soft demodulator. $C_l^i$ is a probability value of a bit which is the l-th bit of 9 code bits that form an i-th codeword among s1 codewords corresponding to a data word having 1 as the first bit. Referring to FIG. 4, since the number of codewords corresponding to a data word having 1 as the first bit is 40, s1 is 40.

$$APP(d=0) = \sum_{h=1}^{s2} \exp\left[\sum_{l=1}^{L} (C_l^h - R_l)^2\right] \quad (2)$$

In equation 2, L is 9 and $R_l$ is the same as in equation 1. $C_l^h$ is a probability value of a bit which is the l-th bit of 9 code bits that form an h-th codeword among s2 codewords corresponding to a data word having 0 as the first bit. Referring to FIG. 4, since the number of codewords corresponding to a data word having 0 as the first bit is 40, s2 is 40.

After obtaining APP(d=1) and APP(d=0) according to equations 1 and 2, an LR is obtained by equation 3:

$$LR = APP(d=1) \div APP(d=0) \quad (3)$$

Meanwhile, if computation of the exponent term is complicated in equations 1 and 2, the computation of the exponent part is not carried out and instead, APP(d=1) and APP(d=0) are obtained by equations 4 and 5 and an LR is obtained by equation 6:

$$APP(d=1) = \text{Max}\left[\left(\sum_{l=1}^{L}(C_l^i - R_l)^2\right), \ldots, \left(\sum_{l=1}^{L}(C_l^{s1} - R_l)^2\right)\right] \quad (4)$$

In equation 4, $R_l$ and $C_l^i$ are the same as in equation 1, and L and s1 are 9 and 40, respectively, as in equation 1. That is, in equation 4, a maximum value among 40 values satisfying $$\sum_{l=1}^{9}(c_l^i - R_l)^2$$

is determined as APP(d=1).

$$APP(d=0) = \text{Max}\left[\left(\sum_{l=1}^{L}(C_l^1 - R_l)^2\right), \ldots, \left(\sum_{l=1}^{L}(C_l^{s2} - R_l)^2\right)\right] \quad (5)$$

In equation 5, $R_l$ and $C_l^h$ are the same as in equation 2, and L and s2 are 9 and 40, respectively, as in equation 2. That is, in equation 5, a maximum value among 40 values satisfying $$\sum_{l=1}^{9}(C_l^h - R_l)^2$$

is determined as APP(d=0).

After APP(d=1) and APP(d=0) are obtained according to equations 4 and 5, an LR is obtained by equation 6:

$$LR = APP(d=1) - APP(d=0) \quad (6)$$

However, where an LR is obtained by the method described above, LR should be calculated using all codewords corresponding to a 1-bit data word. Accordingly, the more complicated a code is, the longer the computation time and the greater the complexity.

SUMMARY OF THE INVENTION

The present invention provides a signal demodulation apparatus which, by using data having high reliability among data indicating probability values of a codeword, decreases a number of codewords used in calculating a value indicating the probability of a data word such that computation speed increases and complexity decreases.

The present invention also provides a method of signal demodulation by which, by using data having a high reliability among data indicating probability values of a codeword, a number of codewords used in calculation of a value indicating a probability of a data word is reduced such that computation speed increases and complexity decreases.

According to an aspect of the present invention, there is provided a signal demodulation apparatus which demodulates a code that is modulated from an N-bit data word into an M-bit codeword. The signal demodulation apparatus comprises a reliability detection unit which receives data comprising a plurality of probability data values indicating a probability value of the code, and after forming data of a predetermined length L as one unit, compares an absolute value of each of the probability data values forming the one unit with a predetermined reference value, and outputs location information and sign information of each probability data value having an absolute value greater than the predetermined reference value; a sign comparison unit which receives the location information and sign information of the probability data values greater than the predetermined reference value, and using a plurality of codewords stored in advance, compares a sign of a code of a codeword corresponding to the location of the data with the sign information, and outputs a plurality of codewords in which the signs are the same as the signs of the probability data values having an absolute value greater than the predetermined reference value; and a data word probability value calculation unit which receives the plurality of codewords output from the sign comparison unit, and data indicating the probability value of the code and calculates a value indicating a probability of a bit for each bit forming the data word.

The reliability detection unit comprises a reference value storage unit which stores the predetermined reference value; an input data storage unit which receives the data indicating the probability value of a code, and stores the data in the units of data of the predetermined length L; and a determining unit which receives each of the probability data values from the input data storage unit, receives the predetermined reference value from the reference value storage unit, performs the comparison, and outputs the location and sign information of the probability data values having an absolute value greater than the predetermined reference value.

The sign comparison unit comprises a code table storage unit which stores a codeword table in which a plurality of codewords corresponding to a data word are written; and a comparison unit which reads codewords from the code table storage unit, performs the sign comparison on each read codeword, and outputs the plurality of codewords in which the signs are the same as the signs of the probability data values having an absolute value greater than the predetermined reference value.

According to another aspect of the present invention, there is provided a method of demodulating a code that is modulated from an N-bit data word into an M-bit codeword. The method comprises forming data indicating probability values of the code into a unit having a predetermined length L; comparing each probability value in the unit with a predetermined reference value; obtaining location information and sign information of each probability value having an absolute value greater than the predetermined reference value; comparing the obtained location information and sign information with corresponding location and sign information of each of a plurality of predetermined codewords corresponding to a data word; outputting the codewords having location and sign information which matches the obtained location and sign information; and calculating a value indicating a probability of a bit for each bit forming the data word based on the output codewords and the probability values forming the unit of predetermined length L.

In an aspect of the invention, the method of demodulating the code further comprises storing the predetermined reference value; and storing the data indicating the probability values of the code in units of data of a predetermined length L.

In an aspect of the invention, the method of demodulating the code further comprises storing a codeword table including the plurality of codewords corresponding to the data word.

BRIEF DESCRIPTION OF THE DRAWINGS

The above and/or other features and advantages of the present invention will become more apparent by describing in detail preferred embodiments thereof with reference to the attached drawings in which:

FIGS. 3A and 3B are embodiments of RLL encoding tables;

FIG. 4 is an embodiment of a decoding table of an RLL (1, 7) code; and

FIG. 5 is a schematic diagram for explaining an example in which codewords having a same sign as input data having high reliability are determined in the signal demodulation apparatus and the method of signal demodulation according to the present invention.

DESCRIPTION OF THE PREFERRED EMBODIMENTS

The present invention will be explained with reference to an example in which a code rate is ⅔ and an RLL(1, 7) code is used.

Figure 1:
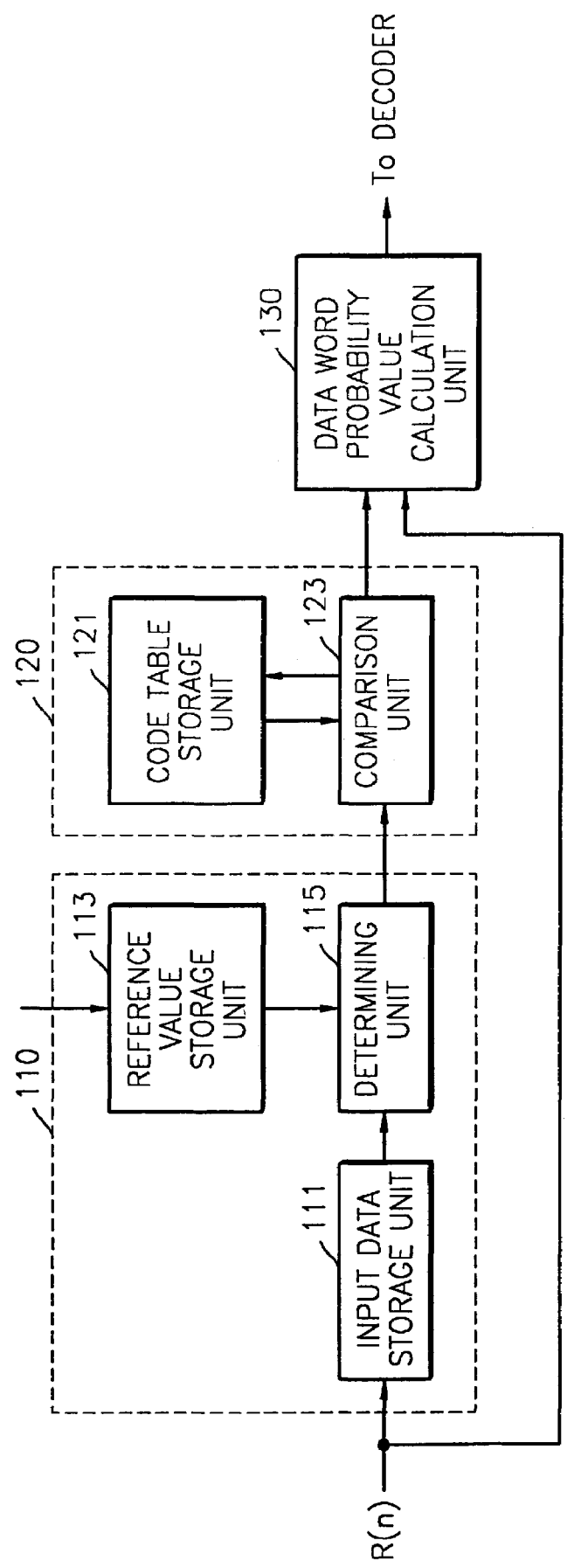
FIG. 1 is a block diagram of an embodiment of a signal demodulation apparatus according to the present invention.

Referring to FIGS. 1, 4, and 5, a structure and operation of a signal demodulation apparatus according to the present invention will now be explained. FIG. 1 is a block diagram of an embodiment of a signal demodulation apparatus according to the present invention. The signal demodulation apparatus comprises a reliability detection unit 110, a sign comparison unit 120, and a data word probability value calculation unit 130. The reliability detection unit 110 comprises an input data storage unit 111, a reference value storage unit 113, and a determining unit 115. The sign comparison unit 120 comprises a code table storage unit 121 and a comparison unit 123.

The input data storage unit 111 receives data values R(n), which are an output of a soft channel detector, for example, a soft Viterbi decoder or a maximum a posteriori probability (MAP) decoder, each of the data values indicating a probability value of a code bit. Then, the input data storage unit 111 stores every 9 data values as one unit, e.g., R(1), R(2), . . . R(9) are stored as one unit. In order to decode a 2-bit data word, a 9-bit codeword is needed, and in order to apply 9 data values to equations 1, 2, 4, and 5, the 9 data values are stored as one unit and are output to the determining unit 115.

The reference value storage unit 113 stores a predetermined reference value and outputs the value to the determining unit 115. The reference value may change according to an external input to the reference value storage unit 113.

The determining unit 115 receives data $R_k$ (k=1, 2, . . . , 9), which is formed by 9 probability value data values $R_1$, $R_2$, . . . , $R_g$ as one unit, from the input data storage unit 111, and receives a predetermined reference value S from the reference value storage unit 113. Then, the determining unit 115 compares each ABS($R_k$), that is, an absolute value of each data value in a data unit, with the predetermined reference value S, and outputs information on the location and sign of $R_k$ values that are greater than the predetermined reference value, to the comparison unit 123. Although 0.8 is used as the predetermined reference value in explaining the invention, the predetermined reference value may change. Accordingly, if the value of $R_k$ is equal to or greater than 0.8, the probability that the data value is 1 is very high and therefore the data value has high reliability. If the value of $R_k$ is equal to or less than −0.8, the probability that the data value is −1 is also very high and the data value also has high reliability.

The code table storage unit 121 stores a codeword table in which a plurality of codewords are written as shown in FIG. 4.

The comparison unit 123 receives information on the locations and signs of the plurality of $R_k$ values that are greater than the predetermined reference value from the determining unit 115. The comparison unit 123 first reads a plurality of codewords corresponding to a data word having 1 as the first bit, from the code table storage unit 121. Referring to FIG. 4, the codewords corresponding to a data word having 1 as the first bit are codewords in the third and fourth columns, and the number of codewords in the third and fourth columns is 40. The comparison unit 123 compares the signs of bits of each codeword in the third and fourth columns with the received information on the signs of the plurality of $R_k$ values that are greater than the predetermined reference value, and by selecting codewords where the respective signs are the same as the respective signs of the received $R_k$ values, determines S1, which is a set of thus selected codewords. For purposes of determining whether the signs are the same, a bit of a codeword having a binary value of 1 is assumed to have an associated plus (+) sign and a bit of a codeword having a binary value of 0 is assumed to have a value of −1 and thus an associated minus (−) sign. For example, an octal value of 425, written in binary as 100 010 101 may be expressed as codeword bits having values of (1, −1, −1, −1, 1, −1, 1, −1, 1).

The comparison unit 123 reads a plurality of codewords corresponding to a data word having −1 as the first bit. Referring to FIG. 4, the codewords corresponding to a data word having −1 as the first bit are codewords in the first and second columns, and a number of codewords in the first and second columns is 40. Then, through sign comparison as described above, the comparison unit 123 determines S2, which is a set of a plurality of codewords selected when the signs are the same.

FIG. 5 is a diagram showing an example process for determining S2. Assuming that $R_k$ is (−0.8, 0, 0, 0.8, 0, 0.7, 0, 0, −0.9) and the reference value is 0.8, the determining unit 115 outputs to the comparison unit 123 information on locations, that is, k is 1, 4 and 9, and information on signs, that is, −1, +1, and −1, respectively. The comparison unit 123 reads 40 codewords in the first and second columns of the table of FIG. 4, and performs sign comparison as shown in FIG. 5. For $R_k$ values whose location is 1 having the sign of −1, the comparison unit 123 compares the signs of codewords corresponding to location 1 and removes codewords having a sign of +1. Since a code bit of a codeword that is 0 actually corresponds to −1, the code bit 0 is selected. For the locations k of 4 and 9, a corresponding sign comparison is performed and matching codewords, (for example, the first, second and fourth codewords, corresponding to octal 040, 050 and 052, indicated in FIG. 5), are selected and output to the data word probability value calculation unit 130. If all the codewords shown in FIG. 4 are expanded to binary form, codewords 240, 250, 252, 042, 044, 242 and 244 of the Table of FIG. 4 are also indicated as a match to the sample data set (−0.8, 0, 0, 0.8, 0, 0.7, 0, 0, −0.9).

The data word probability value calculation unit 130 receives S1 from the comparison unit 123, e.g., receives R(1), R(2), . . . , R(9), which are the same data as the data input to and stored in the input data storage unit 111, and then calculates APP(d=1) according to equation 1 or 4. The data word probability value calculation unit 130 receives S2 from the comparison unit 123 and calculates APP(d=0) according to equation 2 or 5. Meanwhile, a value of s1 in equations 1 and 4 is, for example, 40, in the related art described above, but the number of elements of the set S1 is less than 40 in the embodiment of the present invention. Also, the value of s2 in equations 2 and 5 is 40 in the related art described above, but a number of elements of the set S2 is also less than 40 in the embodiment of the present invention. Accordingly, a number of computations needed to calculate equations 1 through 6 is reduced. The data word probability calculation unit 130 calculates APP(d=1) and APP(d=0) and then, using equation 3 or 6, calculates and outputs an LR. The LR, which is the output of the data word probability value calculation unit 130, is input to a decoder such as a turbo decoder and a data word is finally decoded.

Figure 2:
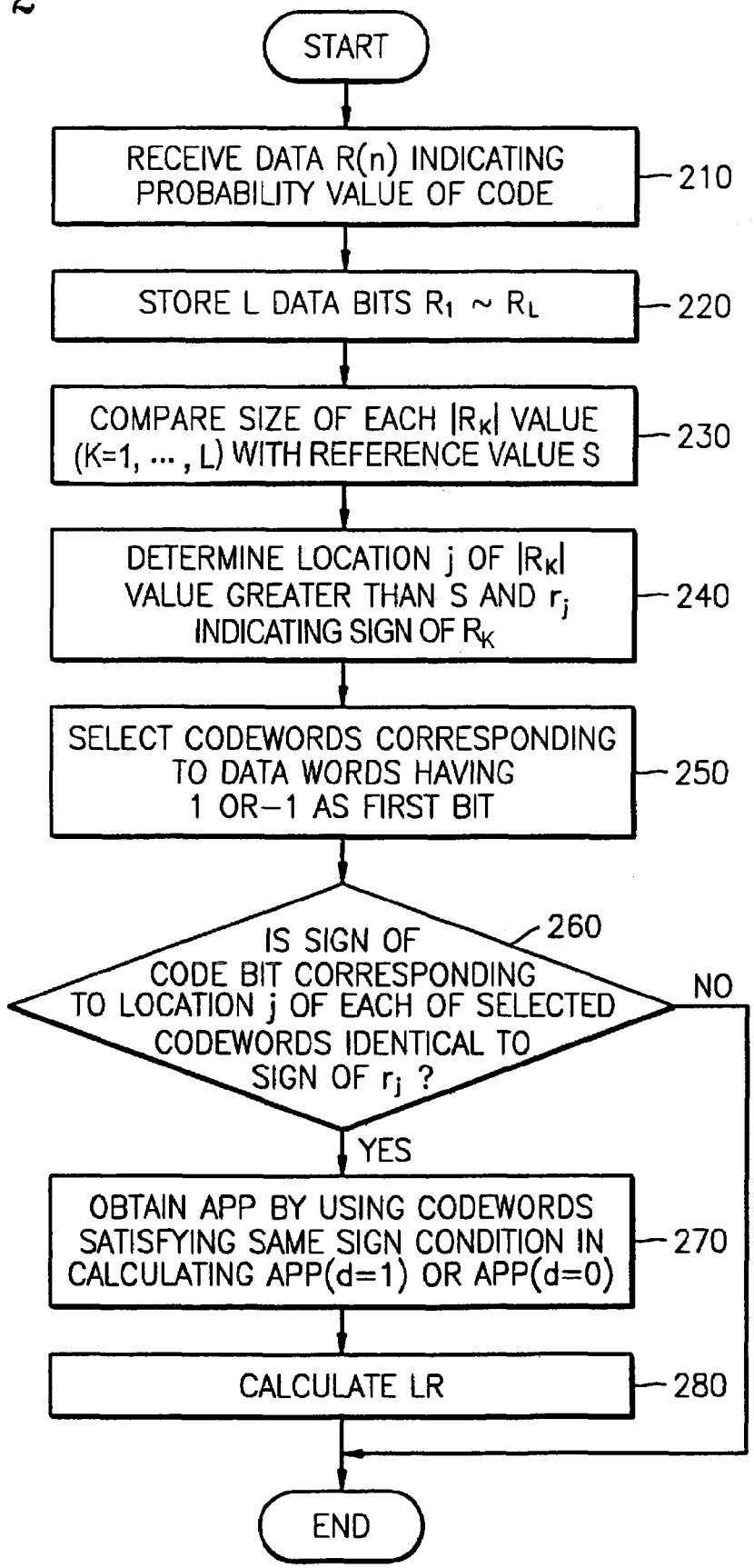
FIG. 2 is a flowchart for explaining an embodiment of a signal demodulation method according to the present invention.

Referring to FIGS. 1 and 2, an embodiment of a method of signal demodulation according to the present invention will now be explained. FIG. 2 is a flowchart for explaining an embodiment of a signal demodulation method according to the present invention. The method of signal demodulation may, for example, be implemented by the signal demodulation apparatus shown in FIG. 1.

Data R(n) that indicates a probability value of a code bit is input in operation 210. After receiving R(n), L data bits $R_1, R_2, \ldots, R_L$, are stored as one unit in operation 220.

An absolute value of each probability value, $ABS(R_k)$, of data $R_k$ (k=1, 2, . . . , L) that is formed by L probability values $R_1, R_2, \ldots, R_L$ as one unit is compared with the predetermined reference value S in operation 230.

Location information j of $R_k$ values that are greater than the predetermined reference value S and sign information $r_j$ indicating a sign of $R_k$, are determined in operation 240.

Codewords corresponding to a data word having 1 as a first bit and codewords corresponding to a data word having −1 as the first bit are selected and read from a code storage table in in operation 250.

Among codewords corresponding to a data word having 1 as the first bit and a data word having −1 as the first bit, the signs of bits of a codeword corresponding to the location information j of a plurality of $R_k$ values that are greater than the predetermined reference value S are compared with sign information $r_j$. By selecting a codeword when the signs are the same, S1, which is formed by codewords selected among a plurality of codewords corresponding to the data word having 1 as the first bit, and S2, which is formed by codewords selected among a plurality of codewords corresponding to the data word having −1 as the first bit are determined in operation 260.

APP(d=1) is calculated according to equation 1 or 4, and APP(d=0) is calculated according to equation 2 or 5. The value of s1 in equations 1 and 4 becomes the number of elements of the set S1, and the value of s2 in equations 2 and 5 becomes the number of elements of the set S2 in operation 270.

An LR is calculated using equation 3 or 6 in operation 280.

The present invention may be embodied in a computer readable code which may be embodied in a computer readable recording medium. The computer readable recording medium may include any kind of recording apparatus on which computer readable data may be stored.

The computer readable recording media includes storage media such as magnetic storage media (e.g., ROM's, floppy disks, hard disks, etc.), optically readable media (e.g., CD-ROMs, DVDs, etc.) and carrier waves (e.g., transmissions over the Internet). Also, the computer readable recording media may be allocated on computer systems which are connected through a network and which store and execute a computer readable code in a distributed mode.

As described above, by using data having high reliability among data indicating probability values of a codeword, the signal demodulation apparatus and method according to the present invention decrease a number of codewords used in calculation of a value indicating the probability of a data word such that a computation speed increases and complexity of the system decreases.

What is claimed is:

1. A signal demodulation apparatus which demodulates a code that is modulated from an N-bit data word into an M-bit codeword, comprising:

a reliability detection unit which receives data indicating probability values of the code, and after forming the probability values into a unit having a predetermined length L, compares an absolute value of each probability value forming the one unit with a predetermined reference value, and outputs location information and sign information of the probability data values forming the one unit that have an absolute value greater than the predetermined reference value;

a sign comparison unit which compares the location and sign information with corresponding location and sign information of respective ones of a plurality of codewords stored in advance and outputs the codewords in which the location and sign information of the respective codeword are the same as the location and sign information output by the reliability detection unit; and a data word probability value calculation unit which calculates a value indicating the probability of a bit for each bit forming the data word based on the codewords output by the sign comparison unit and the data indicating the probability values of the code.

2. The signal demodulation apparatus of claim 1, wherein the reliability detection unit comprises:

a reference value storage unit which stores the predetermined reference value an input data storage unit which receives the data indicating the probability values of the code, and stores the data in units of data of a predetermined length L; and a determining unit which receives each of the probability values from the input data storage unit, receives the predetermined reference value from the reference value storage unit, performs the comparison, and outputs the location and sign information of the probability values having an absolute value greater than the predetermined reference value.

3. The signal demodulation apparatus of claim 1, wherein the sign comparison unit comprises:

a code table storage unit which stores a codeword table in which a plurality of codewords corresponding to a data word are written; and a comparison unit which reads codewords from the code table storage unit, performs the sign comparison of the output location and sign information with respective location and sign information of each read codeword, and outputs a plurality of codewords in which the location and sign information of the respective codeword are the same as the output location and sign information output by the reliability detection unit.

4. The signal demodulation apparatus of claim 1, wherein the predetermined length L is 3 times a length of the M-bit codeword.

5. The signal demodulation apparatus of claim 2, wherein the predetermined length L is 3 times a length of the M-bit codeword.

6. The signal demodulation apparatus of claim 3, wherein the sign comparison unit reads codewords corresponding to a data word having 1 as a first bit, from the code table storage unit, performs the sign comparison, and outputs S1, which is a set of a plurality of codewords in which the signs are the same, and reads codewords corresponding to a data word having −1 as the first bit, from the code table storage unit, performs the sign comparison, and outputs S2, which is a set of a plurality of codewords in which the signs are the same.

7. The signal demodulation apparatus of claim 6, wherein the data word probability value calculation unit obtains an LR, which is a value indicating a probability of each bit forming the data word, according to the following equations:

$$APP(d=1) = \sum_{i=1}^{s1} \exp\left[\sum_{l=1}^{L} (C_l^i - R_l)^2\right]$$

$$APP(d=0) = \sum_{h=1}^{s2} \exp\left[\sum_{l=1}^{L} (C_l^h - R_l)^2\right]$$

$$LR = APP(d=1) \div APP(d=0)$$

where s1 is a value corresponding to a number of elements of the set S1, s2 is a value corresponding to a number of elements of the set S2, $R_1$ is a value indicating a probability value of a bit which is the l-th bit of the probability value data having the unit length L, $C_l^i$ is a value indicating a probability value of a bit which is the l-th bit of L code bits forming an i-th codeword among the s1 codewords, and $C_l^h$ is a value indicating a probability value of a bit which is the l-th bit of L code bits forming an h-th codeword among the s2 codewords.

8. The signal demodulation apparatus of claim 6, wherein the data word probability value calculation unit obtains an LR, which is a value indicating a probability of each bit forming the data word, according to the following equations:

$$APP(d=1) = \text{Max}\left[\left(\sum_{l=1}^{L} (C_l^1 - R_l)^2\right), \ldots, \left(\sum_{l=1}^{L} (C_l^{s1} - R_l)^2\right)\right]$$

$$APP(d=0) = \text{Max}\left[\left(\sum_{l=1}^{L} (C_l^1 - R_l)^2\right), \ldots, \left(\sum_{l=1}^{L} (C_l^{s2} - R_l)^2\right)\right]$$

$$LR = APP(d=1) - APP(d=0)$$

where s1 is a value corresponding to a number of elements of the set S1, s2 is a value corresponding to a number of elements of the set S2, $R_l$ is a value indicating a probability value of a bit which is the l-th bit of the probability value data having the unit length L, $C_l^k$ in the equation to obtain APP(d=1) is a value indicating a probability value of a bit which is the l-th bit of L code bits forming a k-th codeword among the s1 codewords, and $C_l^j$ in the equation to obtain APP(d=0) is a value indicating a probability value of a bit which is the l-th bit of L code bits forming a j-th codeword among the s2 codewords.

9. A method of demodulating a code that is modulated from an N-bit data word into an M-bit codeword, comprising:

forming data indicating probability values of the code into a unit having a predetermined length L;

comparing each probability value in the unit with a predetermined reference value;

obtaining location information and sign information of each probability value greater than the predetermined reference value;

comparing the obtained location information and sign information with corresponding location and sign information of each of a plurality of predetermined codewords corresponding to a data word;

outputting the codewords having location and sign information which match the obtained location and sign information; and calculating a value indicating a probability of a bit for each bit forming the data word based on the output codewords and the probability values forming the unit of predetermined length L.

10. The method of claim 9, further comprising:
storing the predetermined reference value; and
storing the data indicating the probability values of the code in units of data of a predetermined length L.

11. The method of claim 9, further comprising:
storing the predetermined codewords in a codeword table.

12. The method of claim 9, wherein:
the comparing of the location information and sign information with corresponding location and sign information, and the outputting of the stored codeword having location and sign information which matches the obtained location and sign information comprises:

selecting first codewords corresponding to a data word having 1 as a first bit from the predetermined codewords, performing the sign comparison on the first codewords, outputting the first codewords which match the obtained location and sign information as a set S1, selecting second codewords corresponding to a data word having −1 as a first bit from among the predetermined codewords, performing the sign comparison on the second codewords, and outputting the second codewords which match the obtained location and sign information as a set S2.

13. The signal demodulation method of claim 9, wherein the predetermined length L is 3 times a length of the M-bit codeword.

14. The signal demodulation method of claim 10, wherein the predetermined length L is 3 times a length of the M-bit codeword.

15. The signal demodulation method of claim 12, wherein in the calculating of a value indicating a probability of a bit, an LR that is a value indicating the probability of each bit forming the data word is obtained according to the following equation:

$$APP(d=1) = \sum_{i=1}^{s1} \exp\left[\sum_{l=1}^{L} (C_l^i - R_l)^2\right]$$

$$APP(d=0) = \sum_{h=1}^{s2} \exp\left[\sum_{l=1}^{L} (C_l^h - R_l)^2\right]$$

$$LR = APP(d=1) \div APP(d=0)$$

where s1 is a value corresponding to a number of elements of the set S1, s2 is a value corresponding to a number of elements of the set S2, $R_l$ is a value indicating a probability value of a bit which is the l-th bit of the probability value data having the unit length L, $C_l^i$ is a value indicating a probability value of a bit which is the l-th bit of L code bits forming an i-th codeword among the s1 codewords, and $C_l^h$ is a value indicating a probability value of a bit which is the l-th bit of L code bits forming an h-th codeword among the s2 codewords.

16. The signal demodulation method of claim 12, wherein in the calculating of a value indicating a probability of a bit, an LR that is a value indicating the probability of each bit forming the data word is obtained according to the following equations:

$$APP(d=1) = \text{Max}\left[\left(\sum_{l=1}^{L}(C_l^1 - R_l)^2\right), \ldots, \left(\sum_{l=1}^{L}(C_l^{s1} - R_l)^2\right)\right]$$

$$APP(d=0) = \text{Max}\left[\left(\sum_{l=1}^{L}(C_l^1 - R_l)^2\right), \ldots, \left(\sum_{l=1}^{L}(C_l^{s2} - R_l)^2\right)\right]$$

$$LR = APP(d=1) - APP(d=0)$$

where s1 is a value corresponding to a number of elements of the set S1, s2 is a value corresponding to a number of elements of the set S2, $R_l$ is a value indicating a probability value of a bit which is the l-th bit of the probability value data having the unit length L, $C_l^k$ in the equation to obtain APP(d=1) is a value indicating a probability value of a bit which is the l-th bit of L code bits forming a k-th codeword among the s1 codewords, and $C_l^j$ in the equation to obtain APP(d=0) is a value indicating a probability value of a bit which is the l-th bit of L code bits forming a j-th codeword among the s2 codewords.

17. A computer readable medium having embodied thereon a computer program for a method of demodulating a code that is modulated from an N-bit data word into an M-bit codeword and is transmitted through a channel, the computer program comprising:
instructions which enable a computer to form data indicating probability values of the code into a unit having a predetermined length L;
instructions which enable the computer to compare each probability value in the unit with a predetermined reference value;
instructions which enable the computer to obtain location information and sign information of each probability value greater than a the predetermined reference value;
instructions which enable the computer to compare the obtained location and sign information with corresponding location and sign information of each of a plurality of predetermined codewords corresponding to a data word;
instructions which enable the computer to determine codeword among the plurality of predetermined codeword which have location and sign information that match the obtained location and sign information; and
instructions which enable a computer to calculate a value indicating a probability for each bit forming the data word based on the determined codeword and the probability values forming the unit of the predetermined length L.

18. A method of demodulating a code that is modulated from an N-bit data word into an M-bit codeword, the method comprising:
inputting the M-bit codeword wherein each bit of the input M-bit codeword is expressed as a value indicating a probability that the bit is a one or a zero;
assigning a first reference sign to each bit location where the respective probability value expresses a first probability of being a one;
assigning a second reference sign to each bit location where the respective probability value expresses a second probability of being a zero;
determining codewords, from among a plurality of reference M-bit codewords, which have a one at each bit location for which a respective first reference sign is assigned and have a zero at each bit location for which a respective second reference sign is assigned; and
calculating a value indicating a probability of a bit for each bit forming the N-bit data word based on the determined reference M-bit codewords and the expressed probability values.

19. The method of claim 18, wherein the first probability is a probability of at least 0.8 and the second probability is a probability of at least 0.8.

20. A method of demodulating a code that is modulated from an N-bit data word into an M-bit codeword, the method comprising:
inputting the M-bit codeword wherein each bit of the input M-bit codeword is expressed as a probability of the bit being 1 or 0;
determining respective bit locations for each bit having a first probability of being either 1 or 0;
determining codewords, from among a plurality of reference M-bit codewords, which have a 1 at each bit location determined to have the first probability of being a 1 and have a 0 at each bit location determined to have the first probability of being a 0; and
calculating a value indicating a probability of a bit for each bit forming the N-bit data word based on the determined reference M-bit codewords and the expressed input probabilities.

21. The method of claim 20, wherein the first probability is a probability of at least 0.8.

22. A signal demodulation apparatus which demodulates a code, output from an optical recording medium, that is modulated from an N-bit data word into an M-bit codeword, comprising:
a reliability detection unit which receives data indicating probability values of the code output from the optical recording medium, and after forming the probability values into a unit having a predetermined length L, compares an absolute value of each probability value forming the one unit with a predetermined reference value, and outputs location information and sign information of the probability data values forming the one unit that have an absolute value greater than the predetermined reference value;
a sign comparison unit which compares the output location and sign information with corresponding location and sign information of respective ones of a plurality of codewords stored in advance and outputs the codewords in which the location and sign information of the respective codeword are the same as the output location and sign information output by the reliability detection unit; and
a data word probability value calculation unit which calculates a value indicating the probability of a bit for each bit forming the data word based on the codewords output by the sign comparison unit and the data indicating the probability values of the code.

* * * * *